United States Patent
Tsuyuno et al.

(10) Patent No.: US 8,339,795 B2
(45) Date of Patent: Dec. 25, 2012

(54) TRANSMISSION CONTROL APPARATUS AND MECHANICALLY AND ELECTRICALLY INTEGRATED TYPE ELECTRONIC CONTROL APPARATUS

(75) Inventors: Nobutake Tsuyuno, Tokai (JP); Itaru Tanabe, Naka (JP); Toshiaki Ishii, Hitachi (JP); Hiroshi Kameyama, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 349 days.

(21) Appl. No.: 12/831,737

(22) Filed: Jul. 7, 2010

(65) Prior Publication Data
US 2011/0075334 A1 Mar. 31, 2011

(30) Foreign Application Priority Data
Sep. 30, 2009 (JP) .................................. 2009-225899

(51) Int. Cl.
*H05K 7/00* (2006.01)
(52) U.S. Cl. .......... 361/760; 310/64; 439/495; 439/589; 318/646
(58) Field of Classification Search .................. 361/760; 310/64; 439/495, 589; 318/646
See application file for complete search history.

(56) References Cited

U.S. PATENT DOCUMENTS

| | | | |
|---|---|---|---|
| 3,639,680 A | 2/1972 | Dempsey, Jr. et al. | |
| 6,395,999 B1 | 5/2002 | Ploix | |
| 2010/0271791 A1 | 10/2010 | Loibl et al. | |

FOREIGN PATENT DOCUMENTS

| | | |
|---|---|---|
| JP | 3-285570 A | 12/1991 |
| JP | 2006-187122 A | 7/2006 |
| JP | 2006-310556 A | 11/2006 |
| WO | WO 01/41519 A1 | 6/2001 |
| WO | WO 2009/033890 A1 | 3/2009 |

OTHER PUBLICATIONS

European Search Report dated Feb. 15, 2011 (Five (5) pages).

*Primary Examiner* — Xiaoliang Chen
(74) *Attorney, Agent, or Firm* — Crowell & Moring LLP (57) ABSTRACT

An object of the present invention is to provide a mechanically and electrically integrated type electronic control apparatus which can be embedded in a compact mechanical part, and has a compact structure while having a high wiring freedom, a high heat dissipation and a high reliability. In a mechanically and electrically integrated type electronic control apparatus provided with a control signal generating part, and an angular wiring member connecting the control signal generating part and a controlled part controlled by a control signal of the control signal generating part, installed within a conductive casing, at least the wiring member has a fixed hole, a surface including the fixed hole is coated in an insulative manner, and the fixed hole is fixed to the conductive casing mechanically while keeping an insulating property.

9 Claims, 7 Drawing Sheets

TRANSMISSION CONTROL APPARATUS AND MECHANICALLY AND ELECTRICALLY INTEGRATED TYPE ELECTRONIC CONTROL APPARATUS

BACKGROUND OF THE INVENTION (1) Field of the Invention

The present invention relates to a transmission control apparatus which is installed in an inner portion of a transmission, and a mechanically and electrically integrated type electronic control apparatus which is used by being integrated with a mechanical part such as a motor vehicle, a ship, a robot or the like and has a compact structure and a high reliability. Particularly, the present invention relates to a mechanically and electrically integrated type electronic control apparatus which can be used in an inner portion of the transmission corresponding to an oil environment including a corrosive component such as a sulfide or the like.

(2) Description of Related Art

With regard to the motor vehicle, various electronic controls are used for tightening of regulations against a fuel consumption and an exhaust gas, and demands against a safety, an amenity and a quietness, the number of the electronic parts is increased, and a layout of a wiring becomes complicated. Further, the transmission tends to be downsizing, and an internal space becomes stereophonic and complicated. In order to install the electronic parts in the internal space mentioned above so as to wire, it is necessary to enhance a freedom of a layout of the wiring in a three-dimensional space.

A flexible substrate has been known as a wiring which is easily folded and has a high three-dimensional layout freedom.

Further, the following is disclosed as a wiring technique using a bus bar.

As shown in JP-A-2006-187122 (patent document 1), there has been known an electric connection box in which an insulation membrane is formed in a bus bar by a powder coating and a conducting path is arranged without shorting with the other conductive member.

As shown in JP-A-3-285570 (patent document 2), there has been known an inverter apparatus in which a plurality of condensers are connected by a parallel electric conductors.

In the flexible substrate, since a pattern is formed by an etching after attaching a copper foil on an insulative film, there is a problem that a cost becomes high if a wiring thickness is increased. Accordingly, a support plate is necessary for being used in a violent oscillation environment such as a transmission, and there is a problem that a layout freedom of the wiring is inversely lowered due to an influence of the support plate. Further, since the wiring is thin, there is a problem that it is hard to radiate heat via the wiring. Further, if the wiring is 0.1 mm or less, there is a problem that the copper wiring corrodes in a transmission oil including a corrosive sulfide and tends to be disconnected.

The patent document 1 forms the insulation membrane in the bus bar by the powder coating, and fixes there to the substrate while leaving a partial conductive portion. Accordingly, there is a problem that it is hard to achieve a three-dimensional wiring layout due to a constraint of the substrate. Further, since a lot of pin holes in an edge portion in the powder coating, the powder coating includes a lot of metal contaminations and can not be used in the environment in the transmission oil in which the sulfide is included and the copper wiring is corroded.

The patent document 2 fixes to the electronic part by the conductive portion, however, does not take into consideration an attachment to a conductive casing such as the transmission or the like.

BRIEF SUMMARY OF THE INVENTION

The present invention is made by taking the problems mentioned above into consideration, and an object of the present invention is to provide a mechanically and electrically integrated type electronic control apparatus in which a layout freedom of a wiring installed within a conductive casing is high.

In accordance with the present invention, there is provided a mechanically and electrically integrated type electronic control apparatus including a control signal generating part, and an angular wiring member connecting the control signal generating part and a controlled part controlled by a control signal of the control signal generating part, and the mechanically and electrically integrated type electronic control apparatus being installed within a conductive casing, wherein at least the wiring member has a fixed hole, a surface including the fixed hole is coated in an insulative manner, and the fixed hole is fixed to the conductive casing mechanically while keeping an insulating property.

Further, in accordance with the present invention, there is provided a transmission control apparatus including a control signal generating part, and an angular wiring member connecting the control signal generating part and a controlled part controlled by a control signal of the control signal generating part, and the transmission control apparatus being installed within a transmission casing, wherein at least the wiring member has a fixed hole, a surface including the fixed hole is coated in an insulative manner, and the fixed hole is fixed to the conductive casing mechanically while keeping an insulating property.

In the present invention, it is preferable that the conductive casing is constructed by a transmission casing.

In the present invention, it is preferable that the angular wiring member is formed by coating a surface including the fixed hole by the insulating material by punching a metal flat plate as a wiring shape having the fixed hole by a press molding, thereafter carrying out a folding work, applying a masking to a place in which a conductive property is necessary, dipping in a solution in which the insulating material is dispersed, and thereafter carrying out a heating and drying process.

In the present invention, it is preferable that the angular wiring member is formed by coating a surface including the fixed hole by the insulating material by forming a metal wire rod as a fixed hole shape and a wiring shape, thereafter flattening by a press molding and applying a masking to a place in which a conductive property is necessary, dipping in a solution in which the insulating material is dispersed, and thereafter carrying out a heating and drying process.

In the present invention, it is preferable that the angular wiring member has a plurality of thicknesses, and a thin angular wiring members are lapped over the thick angular wiring member.

In the present invention, it is preferable that the fixed hole of the angular wiring member is provided at least in the vicinity of the control signal generating part and the controlled part, and a narrow region is provided in a part of the angular wiring member between the control signal generating part and the controlled part.

In the present invention, it is preferable that the insulating coating is achieved by a high polymer material having an imide group.

In the present invention, it is preferable that the angular wiring member employs any two or three kinds of a copper, an iron and an aluminum as a raw material.

In the present invention, it is preferable that the fixed hole is formed as a U-shaped form.

In accordance with the present invention, it is possible to obtain the mechanically and electrically integrated type electronic control apparatus in which the layout freedom of the wiring installed within the conductive casing is high. Accordingly, the present invention can be adapted to an engine, a transmission, a motor and the like in which the electronic control apparatus is embedded in a compact mechanical part.

Other objects, features and advantages of the invention will become apparent from the following description of the embodiments of the invention taken in conjunction with the accompanying drawings.

DETAILED DESCRIPTION OF THE INVENTION

In accordance with the present invention, in a mechanically and electrically integrated type electronic control apparatus provided with a control signal generating part, and an angular wiring member connecting the control signal generating part and a controlled part controlled by a control signal of the control signal generating part, and installed within a conductive casing, characterized in that at least the wiring member has a fixed hole, a surface including the fixed hole is coated in an insulative manner, and the fixed hole is fixed to the conductive casing mechanically while keeping an insulating property.

It is possible to employ an angular wiring member formed by punching a metal flat plate or flattening a metal wire rod by a press molding, as the angular wiring member in accordance with the present invention. If the wire rod is used as it is, it is impossible to fix a shape even if it is wired as a predetermined shape. Accordingly, it is necessary to wire in a step of connecting the control signal generating part or the controlled part, and there are problems that it takes a long time to manufacturing, and a production cost become higher. On the other hand, since it is possible to previously fix to a predetermined shape by using the angular wiring member, there is an effect that the production cost can be reduced. Further, there is a problem that if the previously insulation coated wire rod is flattened by the press molding, a pin hole is generated in the insulating coating. Therefore, it is impossible to use in the transmission oil including the corrosive sulfide. Accordingly, there is an effect that it is possible to coat in an insulative manner without generating any pin hole, by forming the angular wiring member in the predetermined shape, and thereafter dipping into the solution including the insulating material so as to coat in an insulating manner. It is possible to more easily manufacture by punching the metal flat plate, however, a remainder material after punching is increased and a cost becomes higher. On the other hand, in the case of flattening the metal wire rod by the press molding, it is necessary to wire into the predetermined shape, however, there is an effect that it is possible to achieve a low cost without any remainder material.

As the metal raw material, the iron, the copper, the aluminum and the like can be used. If a phosphor bronze corresponding to a copper family metal is used as the raw material, there is an effect that an end portion of the angular wiring member can be used as a connecter terminal, however, it comes to a copper sulfide little by little from the surface by the sulfide in the transmission oil so as to corrode, and the wiring becomes thin. Accordingly, in order to use for a long period within the transmission, it is desirable to employ a thickness which is equal to or more than 0.1 mm.

On the other hand, since the iron and the aluminum are less corroded in the transmission oil, there is an effect that it is possible to make the wiring member thinner than 0.1 mm. Particularly, since the iron has a strong rigidity, it is suited to be used in a place in which a mechanical strength is necessary.

Further, since the aluminum has a high coefficient of thermal conductivity and a small specific gravity, it is suited to be used in the case that a weight saving is necessary. Further, the aluminum can form an insulating coating on a surface in accordance with an alumite treatment, and has an effect that it is possible to simplify a process of forming the insulating coating.

Figure 1:
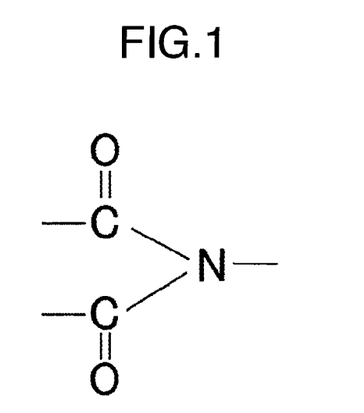
FIG. 1 shows a part of a chemical structure of an insulating coating in accordance with the present invention.

In the insulating coating in accordance with the present invention, it is desirable to use a high polymer material having an imide group shown in FIG. 1. This is because the imide group has a good adhesive property with the metal, and it is confirmed that it has a high durability even in the transmission oil in which the corrosive sulfide exists.

Figure 2:
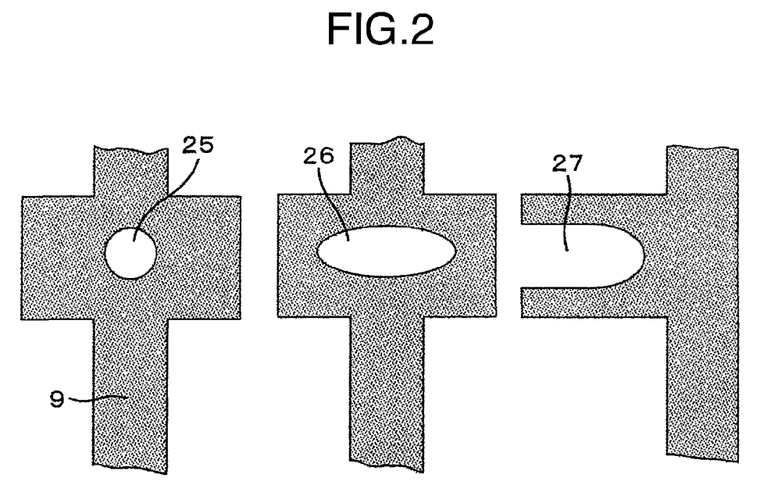
FIG. 2 shows a plan schematic view of a fixed hole in accordance with the present invention.

The fixed hole in accordance with the present invention can employ a circular form 25, an oval form 26, a U-shaped form 27 and shapes similar to them, as shown in FIG. 2. Since the surface including the hole portion of the fixed hole is coated in an insulating manner, it is possible to fix while keeping an electric insulation even by using a conductive screw with respect to the conductive casing. Since the conductive contamination generated by an abrasion of the transmission metal is included in the transmission oil and a short potential is high, there is an effect that a contamination countermeasure can be easily achieved as long as a whole of the fixed hole is coated in an insulating manner.

Figure 3A:
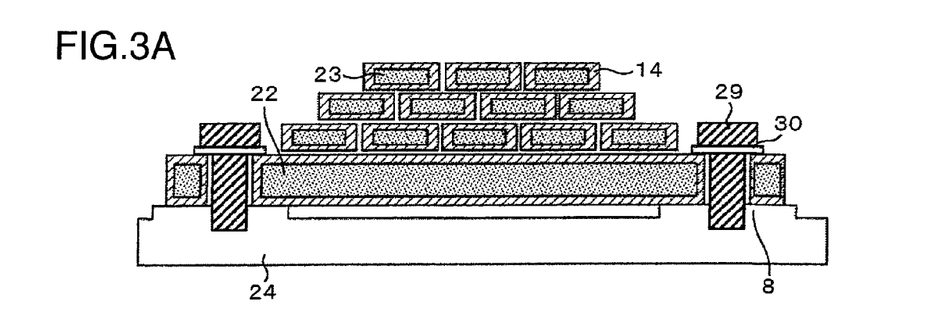
FIGS. 3A to 3C show a schematic view of a cross section in which a thick angular wiring member and a thin angular wiring member are overlapped, in accordance with the present invention.
Figure 3B:
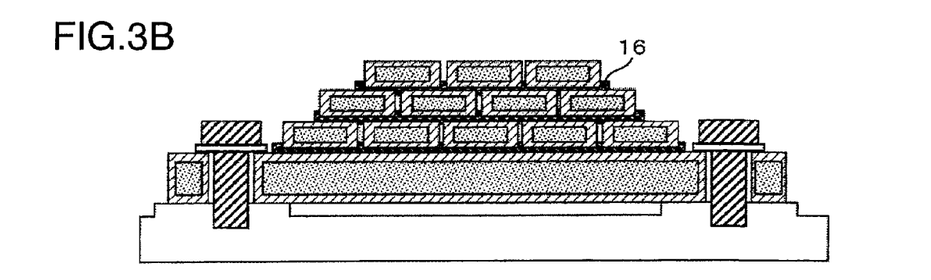
Figure 3C:
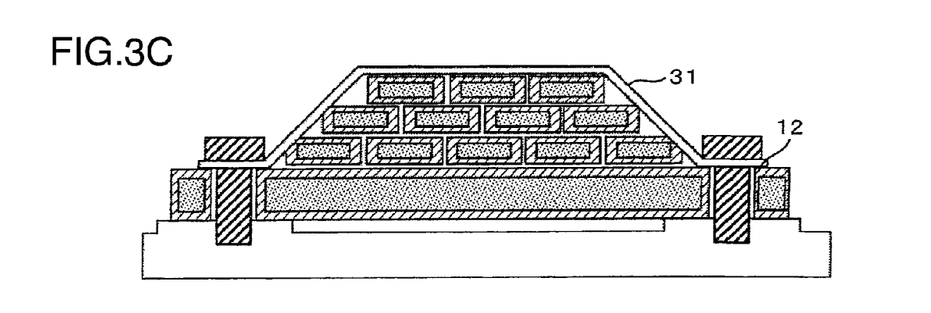

Further, in the present invention, it is possible to support a thin angular wiring member 23 without any support plate by using angular wiring members having a plurality of thicknesses and lapping the thin angular wiring member 23 over a thick angular wiring member 22 as shown in FIG. 3A. It is good to simply overlap, however, it is possible to further improve a vibration proof by partly fixing by means of an adhesive agent 16 or the like as shown in FIG. 3B, or mechanically fixing by using a fixed plate 31 or the like as shown in FIG. 3C, whereby it is possible to enhance an assembling characteristic in the transmission.

The thick angular wiring member means that a thickness of an electric conductor is equal to or more than 0.4 mm, and the thin angular wiring member means that the thickness of the electric conductor is equal to or more than 0.1 mm and less than 0.4 mm.

Figure 4:
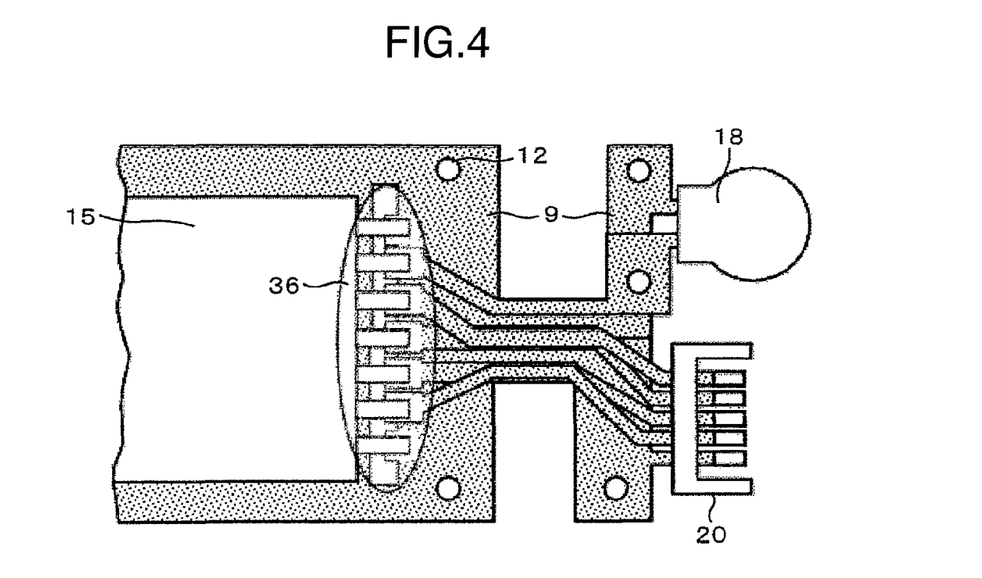
FIG. 4 shows a plan schematic view of a mechanically and electrically integrated type transmission control apparatus in accordance with the present invention.

Further, in the present invention, as shown in FIG. 4, it is desirable to provide a control unit 15 as the control signal generating part and a fixed hole 12 in an angular wiring member 9 in the vicinity of a solenoid 18 as the controlled part, and provide a narrow region between these parts connections. Accordingly, it is possible to radiate heat conducted from the controlled part to the angular wiring member from the fixed portion to the conductive casing, and it is possible to prevent the heat generation of the control part from being conducted to the control signal generating part since the narrow region comes to a heat resistance.

A description will be given below of the present invention by using embodiments and comparative examples. Table 1 shows structures and effects of the embodiments 1 to 4 and the comparative examples 1 and 2.

Embodiment 1

Figure 5:
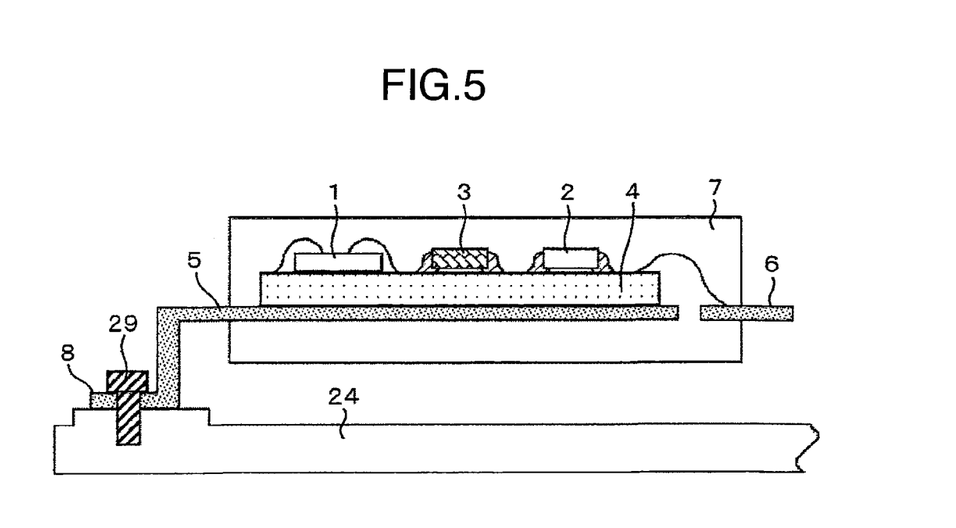
FIG. 5 shows a schematic view of a cross section of a control unit in accordance with the present invention.
Figure 6A:
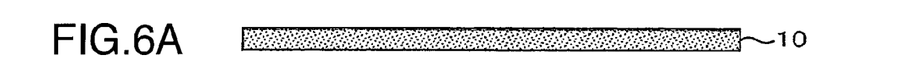
FIGS. 6A to 6G shows a manufacturing method of an angular wiring member in accordance with the present invention.
Figure 6B:
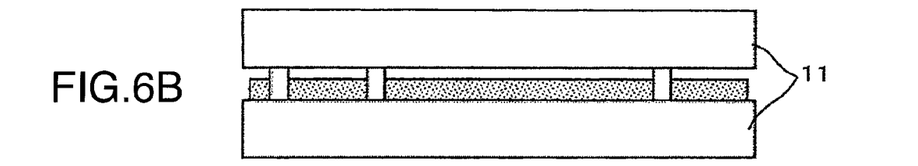
Figure 6C:
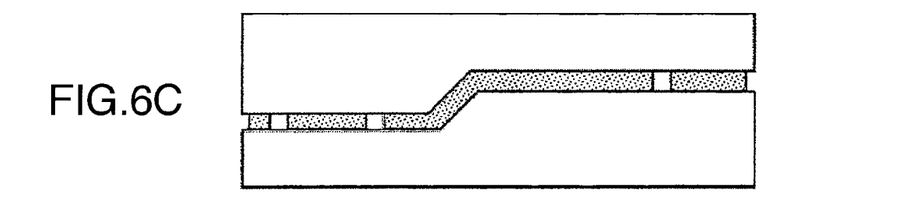
Figure 6D:
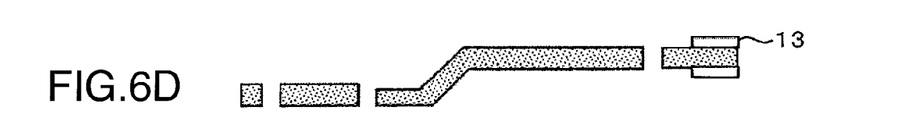
Figure 6E:
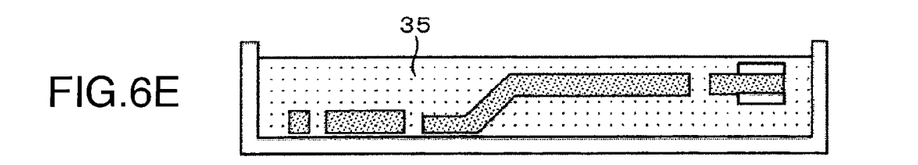
Figure 6F:
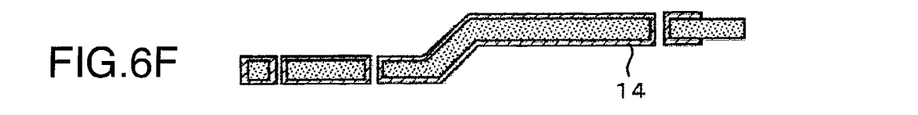
Figure 6G:
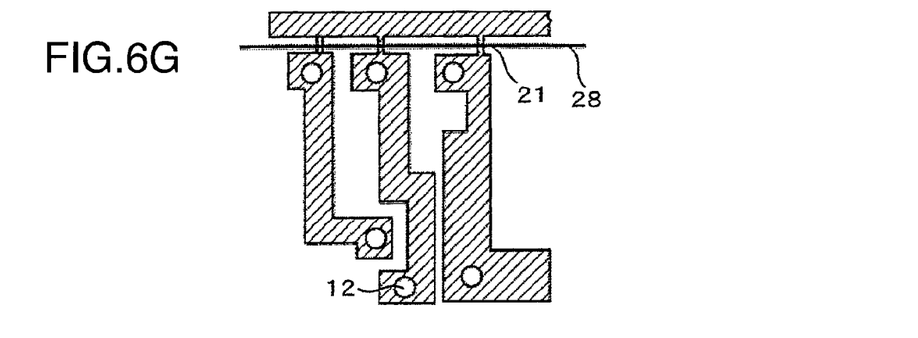

FIG. 5 shows a schematic view of a cross section of a control unit 15 used in the present embodiment. Electronic parts such as a bare chip 1, a chip condenser 2, a chip resistance 3 and the like are mounted on a substrate 4, and the substrate 4 is bonded onto a lead frame 5. An electric signal from the substrate is output through a lead frame 6, and a part of the electronic parts and the lead frames is sealed by a sealing material 7 in accordance with a transfer mold. The lead frame 5 has a fixing structure 8 for fixing and is mechanically fixed to a transmission casing 24.

FIGS. 6A to 6G show a manufacturing step of an angular wiring member 9 in accordance with the present invention. A copper family metal flat plate 10 in which an Ni plating is applied to a whole surface and which has a thickness 0.6 mm is press molded by a metal mold 11 so as to be punched into a predetermined shape. At this time, a fixed hole 12 is also punched. Further, a stereophonic shape is formed by executing a bending work by a metal mold.

Next, an insulating coating 14 is formed by applying a masking 13 to a predetermined position, dipping into a solution in which an insulating material is dispersed, carrying out a heating treatment in a constant temperature bath and carrying out a volatilization of a solvent and an imide reaction of the insulating material. A plurality of angular wiring members are coupled by a tie bar 21 for simultaneously forming the insulating coating and enhancing a workability. The angular wiring member 9 in accordance with the present invention is prepared by cutting the tie bar by a press molding.

Since the insulating coating is not applied to the tie bar portions, there is contrived such that the tie bar portions comes to the end portions which do not overlap at a time of combining the angular wiring members. Further, in a plurality of angular wiring members, the narrow angular wiring member is bonded to the wide angular wiring member by an acrylic or epoxy adhesive agent 16. Accordingly, a thereafter productivity and an assembling characteristic with the transmission are improved.

The insulating coating 14 having the imide group has a good adhesion property with the acrylic or epoxy adhesive agent 16 and can be bonded without applying any special surface treatment. The epoxy adhesive agent has an effect that an adhesive strength retention rate in the oil is high, however, the acrylic adhesive agent has an effect that it is possible to bond for a short time.

Since the insulating coating is applied to the angular wiring member, there is no fear of leading to a trouble such as a short circuit or the like even if it peels off after being assembled in the transmission, so that it may be temporarily fixed.

In the case that the transmission oscillates violently and resonates such as the present embodiment, there is an effect that the resonance is suppressed during a reliability assurance period of the transmission, in addition that the productivity and the assembling characteristic with the transmission are improved by using the epoxy adhesive agent in which the adhesive strength retention rate in the oil is high.

Figure 7:
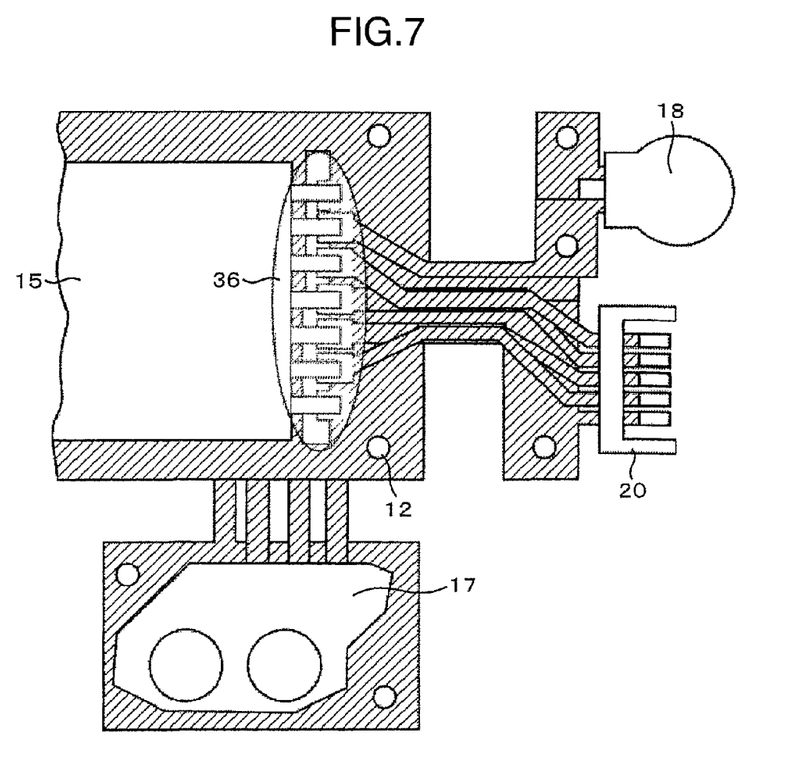
FIG. 7 shows a schematic view of a cross section of a mechanically and electrically integrated type transmission control apparatus in accordance with the present invention.
Figure 8:
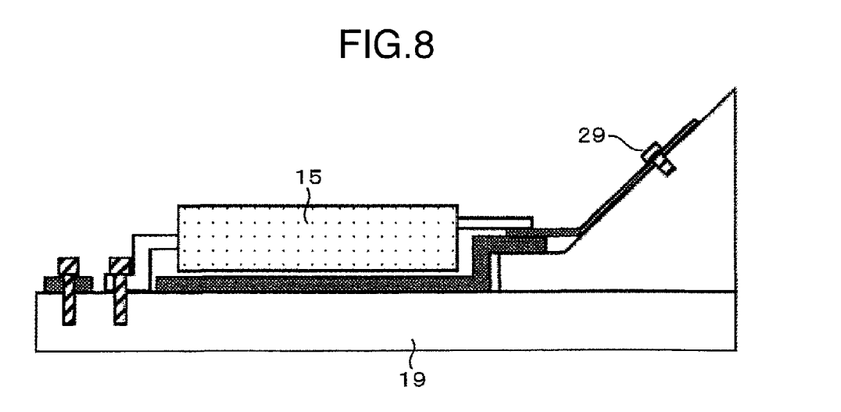
FIG. 8 shows a plan schematic view of the mechanically and electrically integrated type transmission control apparatus in accordance with the present invention.
Figure 9A:
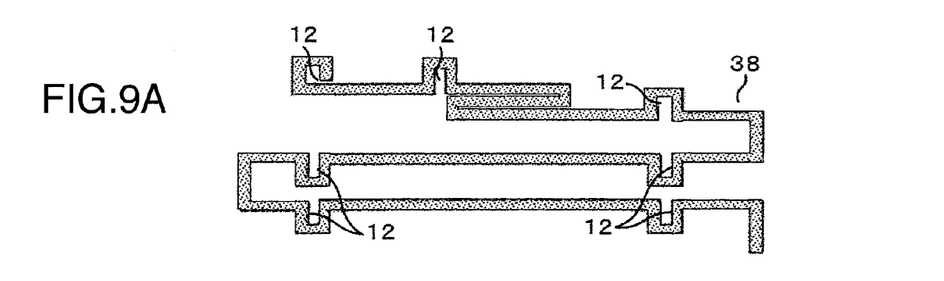
FIGS. 9A to 9F show a manufacturing method of an angular wiring member from a metal wire rod in accordance with the present invention.
Figure 9B:
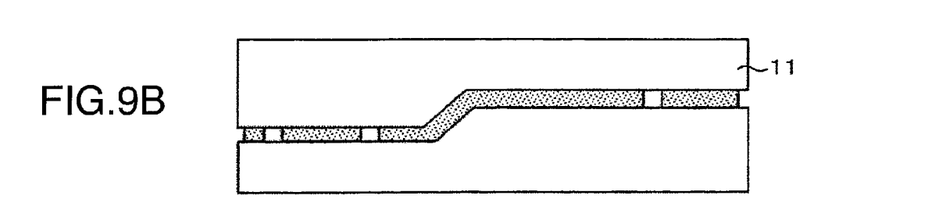
Figure 9C:
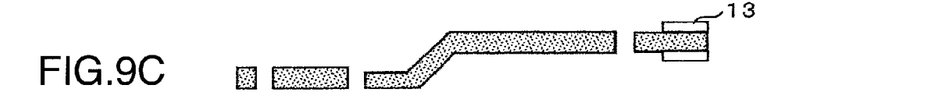
Figure 9D:
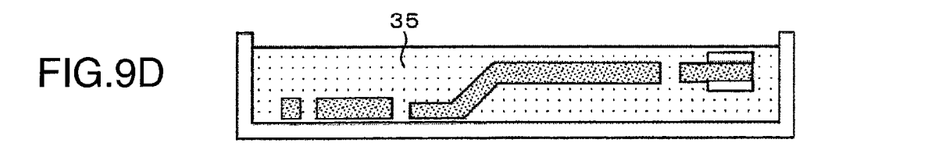
Figure 9E:
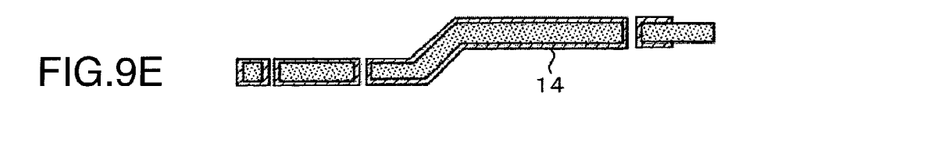
Figure 9F:
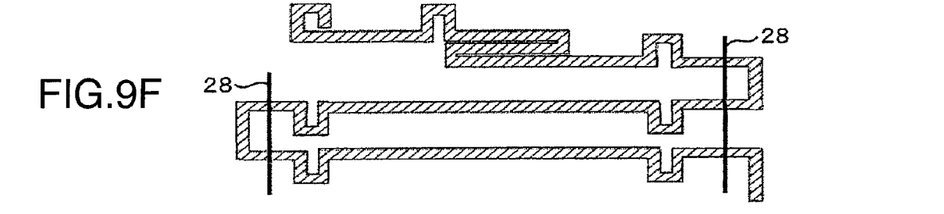

FIG. 7 shows a plan schematic view of a mechanically and electrically integrated type transmission control apparatus in accordance with the present invention, and FIG. 8 shows a schematic view of a cross section. An electromagnetic coil of a solenoid 18 operates on the basis of a control unit 15 transmitting a control signal and the control signal, and the solenoid 18 isolating and releasing a hydraulic flow path provided in a valve body 19, a hydraulic sensor 17, a connector 20 and the like are electrically connected to the angular wiring member 9 in a positive pole and a negative pole.

Since the control unit 15 has a lot of terminals and has a narrow pitch which is equal to or less than 1.5 mm between the terminals, it is metal bonded by a laser welding. Further, since the terminal pitch is narrow, a polyimide group insulating material 36 is coated after the metal bonding, in order to prevent a short circuit by the metal contamination in the transmission oil.

Since a terminal pitch is wide and the number of the terminals is small in the hydraulic sensor 17, the hydraulic sensor 17 is metal bonded by a resistance welding. Further, the solenoid 18 is electrically connected by a pressure welding pressurizing by means of a spring force in such a manner that it can be detached and replaced.

The fixed hole 12 is provided in the angular wiring member 9, and the angular wiring member is mechanically fixed to an aluminum transmission valve body by a screw or the like by using the fixed hole.

Since the fixed hole 12 of the angular wiring member 9 is covered by the insulating coating 14, it is possible to fix to the aluminum valve body having a conductive property while keeping an electric insulation.

It is possible to obtain a rigidity which is necessary for supporting the control unit, the hydraulic sensor and the solenoid without any support member, by making the thickness of the angular wiring member 9 equal to or more than 0.4 mm. Further, it is possible to improve the rigidity by applying a concavity and convexity working to the wide portion of the angular wiring member. Since it is possible to fix the angular wiring member 9 to the conductive transmission casing without any support member while keeping the insulating property, there is an effect that it is possible to flexibly wire and do the layout in correspondence to the shape of the casing.

Further, since the solenoid 18 is constructed by the electromagnetic coil, it generates heat at a time of driving. Since the fixed hole of the angular wiring member is provided in the vicinity of the solenoid, there is an effect that it is possible to effectively radiate the heat of the solenoid to the transmission casing, and it is possible to prevent a control precision from being lowered by a rise of the solenoid temperature.

Further, a narrow region of the angular wiring member is provided between the solenoid and the control unit. Since the thermal resistance is higher in the narrow region than in the wide region, the heat of the solenoid is transmitted to the control unit having the bare chip, and there is an effect that it is possible to prevent an adverse effect of ascending the temperature of the bare chip having a low heat resistance.

In the case of manufacturing the mechanically and electrically integrated type transmission control apparatus as mentioned above, there is obtained effects that a layout freedom of the wiring is high, a productivity is high, an assembling property with the transmission is good, and a contamination resistance, a vibration proof, a transmission oil resistance and a heat dissipation performance are excellent with a good balance.

Embodiment 2

FIG. 3 shows a schematic view of a cross section of an angular wiring member used in the present embodiment. It uses a thick angular wiring member 22 which is made of an iron and has a conductor thickness 0.5 mm, and a thin angular wiring member 23 which is made of a copper and has a conductor thickness 0.2 mm in a combining manner.

The thick angular wiring member 22 has such a mechanical strength as to fix the control unit, the hydraulic sensor, the solenoid and the like to the transmission casing 24, and is made of the iron, thereby further improving the strength. The thin angular wiring member 23 has such an effect that a lot of wirings can be arranged even by a narrow gap. Since it is made of the copper, there is such an effect that an electric resistance is small even if it is thin.

Further, since the surface is insulated and coated, it is possible to wire densely, and there is an effect that the layout freedom of the wiring is high. Further, there is an effect of compensating for the mechanical strength of the thin angular wiring member 23 by the thin angular wiring member so as to enhance the vibration proof, by using both the members in a combining manner.

As shown in FIG. 3C, there is an effect that the vibration proof can be enhanced by making good use of the fixed hole 12 of the thick angular wiring member 22 and integrating it with the thin angular wiring member 23 by the fixed plate 31 or the like so as to fix to the transmission casing 24.

In the case that the mechanically and electrically integrated type transmission control apparatus is manufactured in the same manner as the embodiment 1 so as to be attached to the transmission casing, by using the angular wiring member, there is obtained effects that a layout freedom of the wiring is high, a productivity is high, an assembling property with the transmission is good, and a contamination resistance, a vibration proof, a transmission oil resistance and a heat dissipation performance are excellent with a good balance.

Embodiment 3

An aluminum having a thickness 0.5 mm and an aluminum having a thickness 0.2 mm is used for an electric conductor of the angular wiring member in accordance with the present embodiment. Since the insulating membrane can be formed in accordance with an alumite treatment by using the aluminum for the raw material, there is obtained an effect that a workability for forming the insulating membrane is improved and a material cost is reduced.

Since the aluminum has a lower melting point in comparison with the copper and the iron, it is characterized in that it is easily bonded by an ultrasonic bonding. Accordingly, it is possible to improve a productivity by metal bonding the control unit, the hydraulic sensor and the solenoid to the angular wiring member in accordance with the ultrasonic bonding.

In addition, in the case that the mechanically and electrically integrated type transmission control apparatus is manufactured in the same manner as the embodiment 1, there is obtained effects that a layout freedom of the wiring is high, a productivity is high, an assembling property with the transmission is good, and a contamination resistance, a vibration proof, a transmission oil resistance and a heat dissipation performance are excellent with a good balance.

Embodiment 4

FIGS. 9A to 9F show a manufacturing step of the angular wiring member 9 from a wire rod in accordance with the present invention. A copper wire having a diameter 0.5 mm is formed as a predetermined shape including the fixed hole 12, and is thereafter crushed to a thickness 0.2 mm by a press molding. Further, a stereophonic shape is formed by executing a bending work by means of a metal mold.

There is obtained an effect that a low cost can be achieved with less mills ends in comparison with the case of stamping from a flat plate, by using the wire rod.

In the case that the mechanically and electrically integrated type transmission control apparatus is manufactured by combining the thin angular wiring member manufactured from the wire rod and the thick angular wiring member manufactured from the metal flat plate in the same manner as the embodiment 2 so as to be attached to the transmission casing, there is obtained effects that a layout freedom of the wiring is high, a productivity is high, an assembling property with the transmission is good, and a contamination resistance, a vibration proof, a transmission oil resistance and a heat dissipation performance are excellent with a good balance.

Comparative Example

Figure 10:
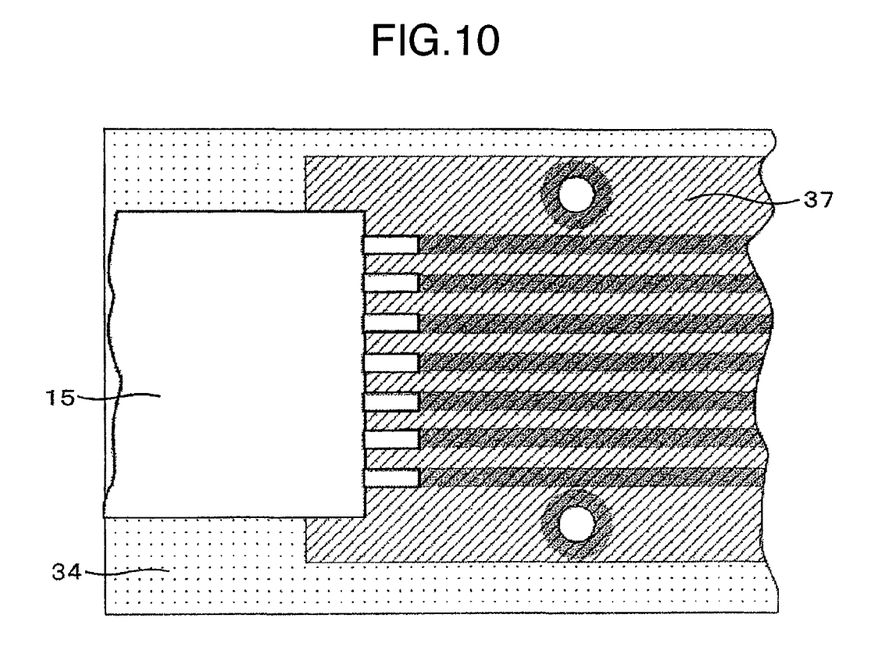
FIG. 10 shows a plan schematic view of a comparative example 1 in accordance with the present invention.

A plan schematic view of a comparative example 1 is shown in FIG. 10. A control unit and a flexible substrate are connected by a solder in the comparative example 1. A copper wiring of a flexible substrate 37 employs a structure obtained by pattern forming a copper foil having a thickness 0.035 mm into a predetermined shape in accordance with an etching.

Since a mechanical strength is small in the flexible wiring, it is necessary to be attached to a support plate 34 for satisfying a vibration proof. Accordingly, there is such a problem that the layout freedom of the wiring is lowered by an influence of the support plate. Further, since the copper foil of 0.035 mm is used as the wiring raw material, there is a problem that a heat dissipation from the wiring is small and a heat dissipation performance is low. Further, since the copper foil is less than 0.1 mm and thin, the copper wiring is corroded under a transmission oil environment generating a hydrogen sulfide so as to be partly disconnected.

Comparative Example 2

Figure 11:
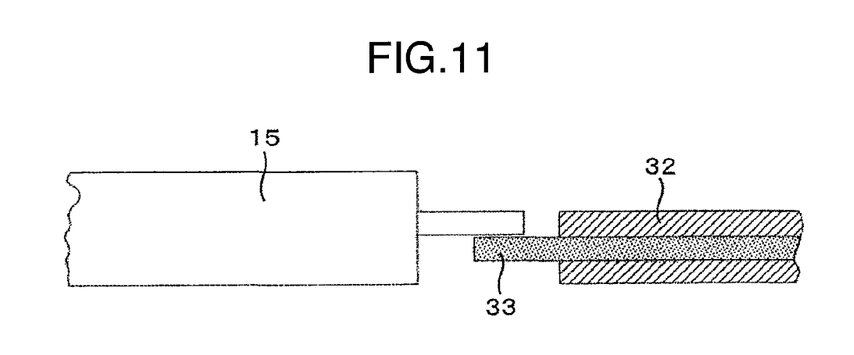
FIG. 11 is a schematic view of a cross section of a comparative example 2 in accordance with the present invention.

A schematic view of a cross section of a comparative example 2 is shown in FIG. 11. A bus bar 33 manufactured by stamping a metal copper plate by means of a press molding is coated by a nylon injection molding. A coating thickness of the nylon 32 at this time comes to 1 mm, and it is hard to thin. Accordingly, the layout freedom of the wiring is lowered, and there is a problem that it is hard to install within the compact transmission.

The structures and the effects of the mechanically and electrically integrated type transmission control apparatuses in accordance with the embodiments 1 to 4 and the comparative examples 1 and 2 are shown in Table 1. From the results of Table 1, in the case that the structure in accordance with the present embodiment is attached to the transmission casing, there is obtained effects that a layout freedom of the wiring is high, a productivity is high, an assembling property with the transmission is good, and a contamination resistance, a vibration proof, a transmission oil resistance and a heat dissipation performance are excellent with a good balance.

an angular wiring member connecting the control signal generating part and a controlled part controlled by a control signal of said control signal generating part; and the mechanically and electrically integrated type electronic control apparatus being installed within a conductive casing, wherein at least said wiring member has a fixed hole, a surface including the fixed hole is coated in an insulative manner, and said fixed hole is fixed to the conductive casing mechanically while keeping an insulating property.

2. A transmission control apparatus as claimed in claim 1, wherein said conductive casing is constructed by a transmission casing.

3. A transmission control apparatus as claimed in claim 1, wherein said angular wiring member is formed by coating a surface including the fixed hole by the insulating material by

TABLE 1

| | | | Embodiment 1 | Embodiment 2 | Embodiment 3 | Embodiment 4 | Comparative Example 1 | Comparative Example 2 |
|---|---|---|---|---|---|---|---|---|
| Construction | wiring | feature | insulating coating angular wiring member | insulating coating angular wiring member | insulating coating angular wiring member | insulating coating angular wiring member | flexible substrate | injection molded bus bar |
| | | conductor A raw material | Ni plating copper plate | Ni plating copper plate | aluminum plate | copper wire | copper foil | copper plate |
| | | pattern forming method | press stamping | press stamping | press stamping | press stamping after wiring into predetermined shape | etching | press stamping |
| | | thickness | 0.6 mm | 0.2 mm | 0.5 mm | 0.2 mm | 0.035 mm | 0.6 mm |
| | | conductor B raw material | — | iron plate | aluminum plate | copper plate | — | — |
| | | pattern forming method | | press stamping | press stamping | press stamping | | |
| | | thickness | | 0.5 mm | 2 mm | 1 mm | | |
| | | insulating material material | polyimide | polyimide | alumite membrane | polyimide | | nylon |
| | | forming method | dipping in solution | dipping in solution | alumite treatment | dipping in solution | film lamination | injection molding |
| | | thickness | 10 μm | 10 μm | 30 μm | 10 μm | 50 μm | 1 mm |
| | | fixed portion shape | hole | hole | hole | conductor A: U shape conductor B: hole | hole | hole |
| | | electric potential fixing method | positive and negative screw | positive and negative screw | positive and negative screw | positive and negative screw | insulating portion screw | insulating portion screw |
| | | support plate | without | without | without | without | with | with |
| effect | | layout freedom of wiring | ○ | ◎ | ◎ | ◎ | Δ (effect of support plate) | X |
| | | contamination countermeasure | ◎ | ◎ | ◎ | ◎ | ◎ | Δ |
| | | vibration proof countermeasure | ○ | ○ | ○ | ○ | Δ | ◎ |
| | | transmission oil resistance | ○ | ○ | ○ | ○ | Δ | ○ |
| | | heat dissipation performance | ○ | ○ | ○ | ○ | X | Δ |
| | | assembling characteristic | ○ | ○ | ○ | ○ | ○ | Δ |

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A mechanically and electrically integrated type electronic control apparatus comprising:
a control signal generating part;

punching a metal flat plate as a wiring shape having the fixed hole by a press molding, thereafter carrying out a folding work, applying a masking to a place in which a conductive property is necessary, dipping in a solution in which the insulating material is dispersed, and thereafter carrying out a heating and drying process.

4. A transmission control apparatus as claimed in claim 1, wherein said angular wiring member is formed by coating a surface including the fixed hole by the insulating material by forming a metal wire rod as a fixed hole shape and a wiring shape, thereafter flattening by a press molding and applying a masking to a place in which a conductive property is necessary, dipping in a solution in which the insulating material is dispersed, and thereafter carrying out a heating and drying process.

5. A transmission control apparatus as claimed in claim 2, wherein said angular wiring member has a plurality of thicknesses, and a thin angular wiring members are lapped over the thick angular wiring member.

6. A transmission control apparatus as claimed in claim 2, wherein the fixed hole of said angular wiring member is provided at least in the vicinity of said control signal generating part and said controlled part, and a narrow region is provided in a part of said angular wiring member between said control signal generating part and said controlled part.

7. A transmission control apparatus as claimed in claim 2, wherein said insulating coating is achieved by a high polymer material having an imide group.

8. A transmission control apparatus as claimed in claim 2, wherein said angular wiring member employs any two or three kinds of a copper, an iron and an aluminum as a raw material.

9. A transmission control apparatus as claimed in claim 2, wherein said fixed hole is formed as a U-shaped form.

* * * * *